United States Patent
Zhang

(10) Patent No.: US 8,907,342 B2
(45) Date of Patent: Dec. 9, 2014

(54) THIN FILM TRANSISTOR ARRAY SUBSTRATE, COLOR FILTER SUBSTRATE AND DISPLAY DEVICE

(75) Inventor: Mi Zhang, Beijing (CN)

(73) Assignee: Boe Technology Group Co., Ltd., Beijing (CN)

(*) Notice: Subject to any disclaimer, the term of this patent is extended or adjusted under 35 U.S.C. 154(b) by 0 days.

(21) Appl. No.: 13/441,107

(22) Filed: Apr. 6, 2012

(65) Prior Publication Data

US 2012/0256183 A1 Oct. 11, 2012

(30) Foreign Application Priority Data

Apr. 7, 2011 (CN) .......................... 2011 1 0086433

(51) Int. Cl.
| | | |
|---|---|---|
| H01L 29/786 | (2006.01) | |
| H05K 1/02 | (2006.01) | |
| G02F 1/1339 | (2006.01) | |
| H01L 27/12 | (2006.01) | |
| G02F 1/1362 | (2006.01) | |

(52) U.S. Cl.
CPC .......... *H01L 27/124* (2013.01); *G02F 1/13394* (2013.01); *G02F 2202/16* (2013.01); *G02F 2001/13398* (2013.01); *G02F 1/136286* (2013.01)
USPC ................. 257/59; 257/223; 257/57

(58) Field of Classification Search
CPC .... H01L 29/786; H01L 27/1214; H05K 1/02; G11C 11/4097; G09G 3/3648; G09G 2300/408
USPC ......... 257/223, 227, 291, 292, 439, 443, 655, 257/59, E27.111
See application file for complete search history.

(56) References Cited

U.S. PATENT DOCUMENTS

| | | | | |
|---|---|---|---|---|
| 5,920,083 A | * | 7/1999 | Bae | 257/59 |
| 6,392,735 B1 | * | 5/2002 | Tani | 349/156 |
| 6,407,793 B1 | * | 6/2002 | Liang et al. | 349/139 |
| 8,373,840 B2 | * | 2/2013 | Jeong | 349/153 |
| 2002/0005928 A1 | * | 1/2002 | Hanakawa et al. | 349/149 |
| 2005/0206815 A1 | * | 9/2005 | Jeong | 349/114 |
| 2006/0228839 A1 | * | 10/2006 | Liao | 438/151 |
| 2008/0088787 A1 | * | 4/2008 | Yim et al. | 349/156 |
| 2009/0027604 A1 | | 1/2009 | Guo | |
| 2010/0110058 A1 | * | 5/2010 | Moh et al. | 345/211 |
| 2011/0063539 A1 | * | 3/2011 | Liao | 349/54 |
| 2011/0211151 A1 | | 9/2011 | Jeong | |

FOREIGN PATENT DOCUMENTS

| | | |
|---|---|---|
| CN | 101097364 A | 1/2008 |
| CN | 101354507 A | 1/2009 |

OTHER PUBLICATIONS

First Chinese Office Action dated Feb. 7, 2014; Appl. No. 201110086433.X.

* cited by examiner

*Primary Examiner* — Marc Armand
*Assistant Examiner* — Quinton Brasfield
(74) *Attorney, Agent, or Firm* — Ladas & Parry LLP

(57) ABSTRACT

Embodiments of the disclosed technology provide to a thin film transistor array substrate comprising a first base substrate; a gate line formed on the first base substrate; and two data lines separately formed on the first base substrate; wherein the two data lines are located on both sides of the gate line respectively in the direction of data signal transmission but do not overlap with the gate line. The two data lines can be electrically connected through conductive elements for transmitting data signals.

6 Claims, 4 Drawing Sheets

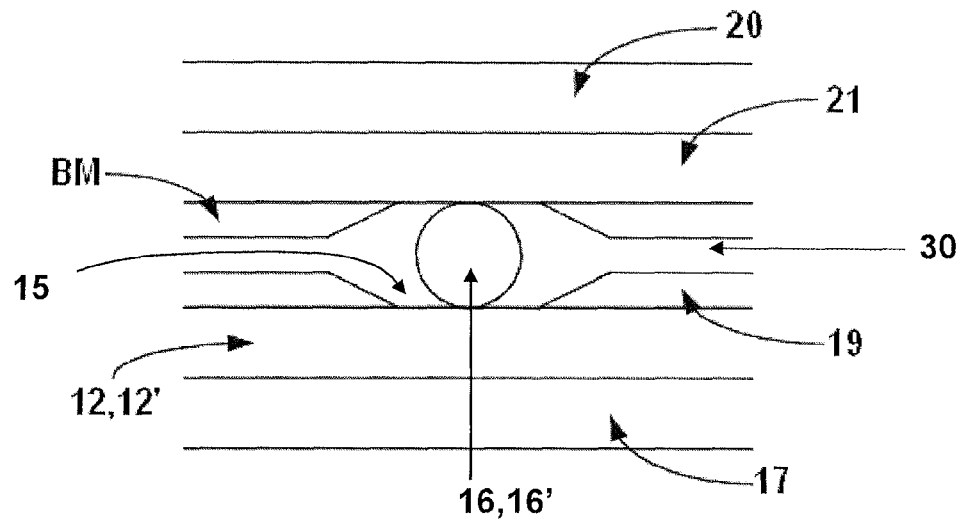
Figure 3
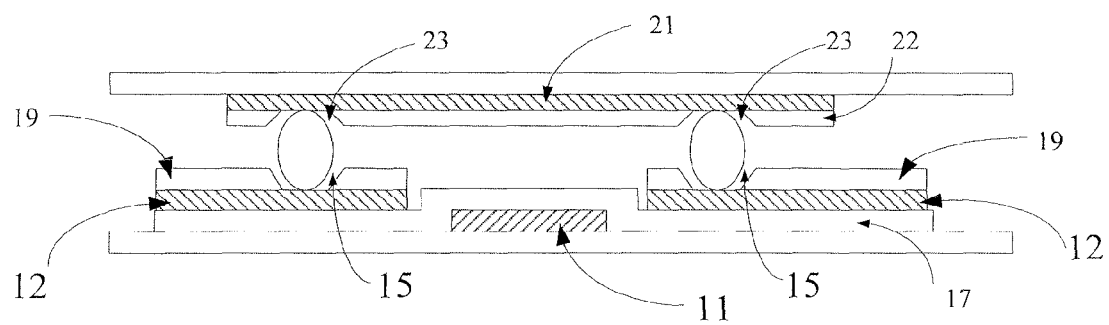
Figure 3.1

THIN FILM TRANSISTOR ARRAY SUBSTRATE, COLOR FILTER SUBSTRATE AND DISPLAY DEVICE

BACKGROUND

Embodiments of the disclosed technology relate to a thin film transistor array substrate, a color filter substrate and a display device.

Liquid Crystal Display (LCDs), due to the advantages such as low work voltage, low power consumption, high circuit integrity, and portability, have been widely developed and applied. Twisted Nematic-LCDs (TN-LCDs), Super Twisted Nematic-LCD (STN-LCDs) and Thin Film Transistor-LCDs (TFT-LCDs) are three important types in the development of the liquid crystal display technology. A TFT-LCD is formed by bonding a thin film transistor (TFT) array substrate and a color filter substrate together with an intermediate liquid crystal layer.

FIG. 1 is a top view of a conventional thin film transistor array substrate comprising a group of gate lines 1 and a group of data lines 2 perpendicular to the gate lines. The gate lines 1 and the data lines 2 are provided at different levels on the substrate, for example, with the data lines 2 being above the gate lines 1, so as to avoid short circuit caused by direct connection between the data lines 2 and the gate lines 1. The region defined by two adjacent gate lines 1 and two adjacent data lines 2 are referred to as a pixel region. To clearly illustrate the relationship between the gate lines 1 and the data lines 2 on the TFT array substrate, only the gate lines 1 and the date lines 2 are shown in FIG. 1, while other elements on the TFT array substrate such as pixel electrodes and storage capacitor electrodes are omitted for simplicity.

As shown in FIG. 1, two gate lines 1 and two data lines 2, perpendicular to the each other, define pixels in an array and form four overlapping regions at the four corners. In each of the overlapping regions, typically only a gate insulation layer is interposed between the gate lines 1 and the data lines 2. During the electrical operation of the thin film transistors, dielectric breakdown is likely occur in the gate insulation layer, resulting short circuit between the gate lines and the data lines and thus the bright lines.

SUMMARY

An embodiment of the disclosed technology provides a thin film transistor array substrate comprising a first base substrate; a gate line formed on the first base substrate; and two data lines separately formed on the first base substrate; wherein the two data lines are located on both sides of the gate line respectively in the direction of data signal transmission but do not overlap with the gate line.

Another embodiment of the disclosed technology provides a color filter substrate comprising a second base substrate; and a data transmission line formed on the second base substrate and adapted for transmitting data signals.

Still another embodiment of the disclosed technology provides a method for manufacturing a thin film transistor array substrate comprising forming a gate line on a first base substrate; and forming two separate data lines on the first base substrate, wherein the two data lines are respectively located on two sides of the gate line in the direction of data signal transmission but do not overlap with the gate line.

Still another embodiment of the disclosed technology provides a method for manufacturing a color filter substrate comprising depositing a metal layer on a second base substrate; and forming a data transmission line capable of transmitting data signals on the second base substrate.

Still another embodiment of the disclosed technology provides a display device comprising a thin film transistor array substrate comprising a first base substrate; a gate line formed on the first base substrate; and two data lines separately formed on the first base substrate, wherein the two data lines are located on both sides of the gate line respectively in the transmission direction of the data signals but do not overlap with the gate line; and a color filter substrate comprising a second base substrate; and a data transmission line formed on the second base substrate and adapted for transmitting data signals.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein:

FIG. 3 is a cross-sectional view showing a gold ball and the elements adjacent thereto as viewed in the direction perpendicular to the data lines and the paper, when the TFT array substrate and the color filter substrate are bonded together with each other according to a first embodiment of the disclosed technology;

FIG. 3.1 is a cross-sectional view showing another embodiment as viewed in the direction perpendicular to the data lines and the paper, when the TFT array substrate and the color filter substrate are bonded together with each other.

DETAILED DESCRIPTION

In order to avoid the short circuit between the gate lines and the data lines caused by the dielectric breakdown occurred in the overlapping regions between the gate lines and data lines, an embodiment of the disclosed technology provides a thin film transistor (TFT) array substrate and a color filter (CF) substrate. On the TFT array substrate, the data lines are not directly overlapped with the gate lines. Instead of overlapping with a gate lines, the data lines according to the embodiment of the disclosed technology are discontinuous to be data line sections at the location of the gate line, thus respectively located on the two sides of the gate lines. To ensure the continuity of signal transmission via data lines, data transmission lines across the gate lines on the array substrate are provided on the color filter substrate facing the TFT array substrate after assembled together so as to connect the data lines (data line sections) on the two sides of the gate lines. Therefore, data signals from one data line on one side of a gate line can be transmitted to the data line on the opposite side of the same gate line. In this case, the short circuit between the gate lines and the data lines caused by the dielectric breakdown occurred in the overlapping regions in the conventional technology can be avoided, without disadvantageously affecting the continuity of signal transmission over the data lines.

Figure 1:
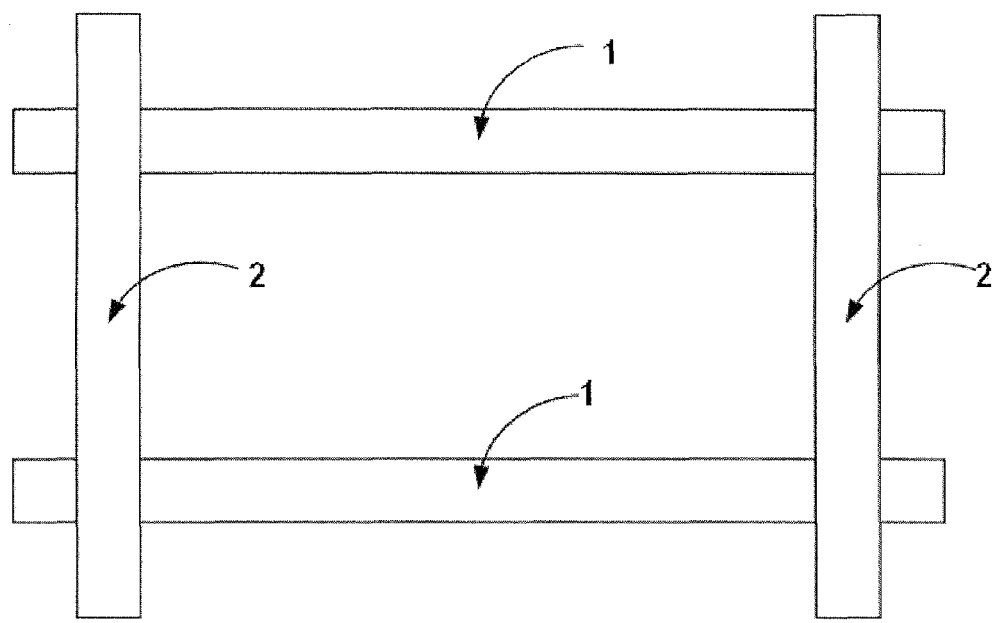
FIG. 1 is a top view showing a conventional TFT array substrate.

It should be understood that although there are four overlapping regions between the two gate lines 1 and the two data lines 2 in the structural schematic view of a conventional thin film transistor array substrate as shown in FIG. 1, for clarity the following description to the embodiments of the disclosed technology are only mention to the way to avoid dielectric breakdown occurred in one overlapping region between one gate line 1 and one data line 2; and the way can be applied to other overlapping region. The solutions of the embodiments of the disclosed technology can be applied to a thin film transistor comprising a group of (a plurality of) gate lines and a group of (a plurality of) data lines.

Hereinafter, the embodiments of the disclosed technology will be described in detail with reference to the drawings.

First Embodiment

In the first embodiment of the disclosed technology, a data transmission line provided on a color filter substrate is used to cross a gate line on an array substrate and connect the data lines (data line sections) on the two sides of the gate line on the array substrate. Therefore, the TFT array substrate and the color filter substrate are designed to be bonded facing each other with an intermediate liquid crystal layer. The TFT array substrate and the color filter substrate will be explained in the following description, respectively.

In the TFT array substrate according to the first embodiment of the disclosed technology, the data lines are discontinuous metal lines in the direction of data transmission, typically perpendicular to the gate line, and these data lines do not overlap with the gate lines on the TFT array substrate. Therefore, the dielectric breakdown is greatly reduced and even can be avoided, and yield rate can be increased.

Figure 2:
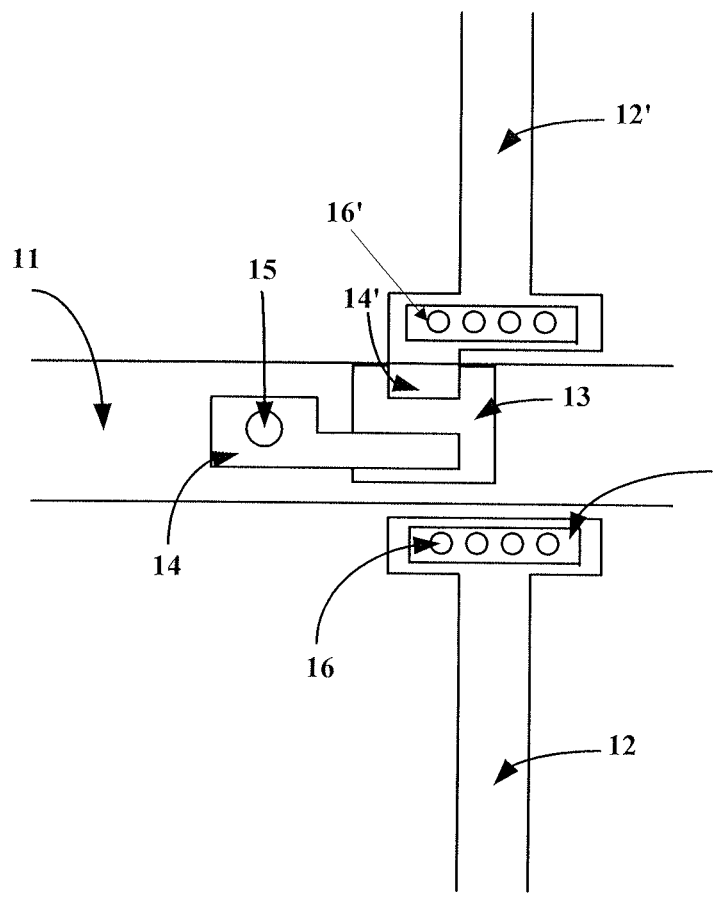
FIG. 2 is a top view showing a TFT array substrate according to a first embodiment of the disclosed technology.

FIG. 2 is the top view of the TFT array substrate according to the first embodiment of the disclosed technology, in which an intersection region between an gate line and a data line is shown. A gate line 11 and two data lines 12, 12' respectively provided on the two sides of the gate line 11, i.e., a first data line 12 and a second data line 12', are provided on a first substrate (not shown, e.g., a transparent substrate such as a glass substrate or a plastic substrate). As shown in FIG. 2, the first data line 12 and the second data line 12' are substantially perpendicular to the gate line 11 and the extending direction intersects with the gate line 11, but do not overlap with the gate line 11.

It should be noted that the dimension of the gap (space) between the first data line 12 and the gate line 11 and the gap (space) between the second data line 12' and the gate line 11 are not restricted, since slightly larger or smaller gaps, as long as they are fit for the length of a data transmission lines on a color filter substrate to establish the electric connection therebetween, can also be used to achieve the intended effect of the disclosed technology.

Further, in the TFT array substrate according to the first embodiment, an active layer 13 and a source/drain (S/D) electrodes 14 are provided above the gate line 11, and a drain/source (S/D) electrode 14' is provided on the second data line 12' on the array substrate. In this example, a part of the gate line 11 works as a gate electrode. Thus the gate line 11, a gate insulation film (not shown), the active layer 13, and the source/drain electrodes 14, 14' form a thin film transistor. One of the source/drain electrodes 14, 14' acts a source electrode, and the other one acts a drain electrode.

A via hole 15 is formed above the source/drain (S/D) electrode 14 above the gate line 11. An insulation layer may be provided on the two data lines 12 and 12', in which case then two via holes 15 are formed above the two data lines 12 and 12' respectively in the insulation layer.

It should be noted that the via holes in this embodiment may be round holes, grooves or other similar structures.

In the available array substrate, there is no overlapping region between the gate line 11 and the first data line 12 or between the gate line 11 and the second data line 12'. That is to say, the first data line 12 only transmits data signals within the pixel region defined by at least the gate line 11 and the first data line 12. It is necessary to provide an external transmission means for transmitting data signals across the gate line 11 (i.e., from the first data line 12 to the second data line 12'). Therefore, short circuit between the gate line 11 and any of the two data lines 12, 12' can be avoided.

With regard to the array substrate according to the first embodiment of the disclosed technology, only the features related to the disclosed technology are discussed above. The array substrate according to the first embodiment, like other conventional array substrate, may further comprise, for example, a gate insulation layer provided on the gate line. The thin film transistor (TFT) provided in a region where the two data lines approach but do not meet the gate line, the source electrode of the TFT may be electrically connected to the data line, and the drain electrode of the TFT may be connected to a pixel electrode. A passivation layer is provided to cover the gate insulation layer, the two data lines and the thin film transistor. Passivation layer via holes or grooves formed in the passivation layer and above the drain electrode of the thin film transistor. The pixel electrode is provided on the passivation layer and electrically connected to the drain electrode of the TFT through a passivation layer via hole or groove.

In the array substrate according to the first embodiment, the gate line, the data lines, and the source electrode and the drain electrode of the thin film transistor can be made of a material selected from the group consisting of aluminum, chromium, tungsten, tantalum, titanium and the combination thereof. The material of the gate insulation layer is, for example, silicon nitride, silicon dioxide or alumina. In addition, the material of the pixel electrode is, for example, indium tin oxide, indium zinc oxide, or aluminum zinc oxide.

With the array substrate, a color filter substrate is processed by forming data transmissions lines 21 on the base substrate 20 (e.g., a glass substrate or a plastic substrate) of the color filter substrate. In the embodiment of the disclosed technology, the data transmission lines 21 can be metal lines or conductive metal oxide lines such as indium tin oxide lines, which are capable of transmitting data signals. However, the material of the data transmission lines is not particularly restricted.

For example, there is a plurality of the data transmission lines on the base substrate of color filter substrate, each of which is a metal line across one corresponding gate line or more gate lines (e.g., two) on the array substrate. Or, for one column of pixels, there may be formed one data transmission line for the pixels from the first to the last one and accordingly corresponding to the gate lines for these pixels, and this data transmission line is used for transmit data signals for the column of pixels in cooperation with the conductive elements and the data lines on the array substrate. The ends of one data transmission line can be electrically connected to the respective ends adjacent to the same gate line of the two data lines 12 and 12' via conductive means such as metal (e.g., gold) balls, respectively. Therefore, the data signals can be transmitted from one data line to another of the data lines across the gate line, and thus a column of pixels are charged for display.

In addition to the gold balls, other conductive elements, such as conductive spacers can be used for connecting the data transmission lines to the corresponding two data lines.

With regard to the color filter substrate according to the first embodiment of the disclosed technology, only the features related to the disclosed technology are discussed above. In fact, the color filter substrate according to the first embodiment, like other conventional color filter substrate, further comprises a black matrix (BM) layer provided on or under the data transmission line; pixel color films (color filters) provided along with the data transmission lines and the black matrix layer, comprising, for example, red color filters, green color filters and blue color filters. A common electrode may be formed above the pixel color filters, the black matrix layer and the data transmission line with an interposed insulation layer. Column spacers or post spacers are erected between adjacent pixel resins for supporting the TFT substrate and the color filter after being assembled. The data transmission line is located the region where the black matrix is formed.

After obtaining the array substrate and color substrate, conductive elements such as first gold balls (AU balls) 16 and second gold balls 16' can be used for electrically connecting the data lines on the array substrate to the corresponding data transmission lines on the color filter substrate. As shown in FIG. 2, there are first gold balls 16 provided in the via hole 15 formed above the first data line 12 and second gold balls 16' provided in the via hole faulted above the second data line 12'. In the drawing, four first gold balls 16 and four second gold balls 16' are shown for illustration purpose only, but the disclosed technology is not limited to the specific number of the balls.

Next, a description will be given of the connection between the components with reference to FIGS. 2 and 3. FIG. 3 is a cross-sectional view showing a gold ball and the adjacent elements as viewed in the direction perpendicular to the data lines (perpendicular to the plain of the paper in FIG. 2), when the TFT array substrate and the color filter substrate are bonded with each other according to the first embodiment of the disclosed technology.

In FIG. 3, the color filter substrate comprising the base substrate 20 and the data transmission line 21 formed thereon is placed above the TFT array substrate with an interposed liquid crystal layer 30, and the cell gap between the color filter substrate and the TFT substrate is maintained with spacers. The gold ball 16 is in direct contact with one data line 12 or 12' on the array substrate and the data transmission line 21 on the color filter substrate. Only one gold ball 16 or 16' is shown as an example. In particular, the lower end of the first gold ball 16 is connected to the first data line 12 on the array substrate through a via hole formed in an insulation layer (passivation layer) on the first data line 12, and the upper end of the first gold ball 16 is connected to the first end of the data transmission line 21 of the color filter substrate. On the other hand, the lower end of the second gold ball 16' is connected to the second data line 12' on the array substrate through a via hole formed in the insulation layer on the second data line 12', and the upper end of the second gold ball 16' is connected to the second end of the data transmission line 21 of the color filter substrate. The first date line 12, the data transmission line 21 and the second data line 12' are electrically connected to form a conductive path by the first gold balls and the second gold balls as described above. To this end, data signals can be transmitted from the first data line 12 to the second data line 12' of the array substrate via the data transmission line 21 of the color filter substrate. This ensures a correct signal transmission.

As shown in FIG. 3, when the TFT array substrate and the color filter substrate are bonded together with each other, both the black matrix layer 13 provided on the data transmission line 21 and the passivation layer 19 (PVX) provided on the data line 12, 12' do not contact with the gold balls. In addition, the gate insulation layer 17 is located under the data lines 12, 12' on the array substrate.

It should be understood that since there is no overlapping region between the gate line and the data lines, the gate line and the data lines can be formed at the same level without a gate insulation layer provided therebetween in an embodiment of the disclosed technology. Obviously, the gate line and the data lines can be also formed at different levels with a gate insulation layer provided therebetween in another embodiment of the disclosed technology.

The structure of the TFT array substrate described with reference to FIGS. 2 and 3 is one of the exemplary structures for embodying the disclosed technology. However, the disclosed technology is not limited to this structure. According to the disclosed technology, in any TFT array substrate on which the gate lines and the data lines overlap with each other, the short circuit between the gate lines and the data lines can be avoided by replacing each of the continuous data lines with discontinuous data lines (data line sections) which do not overlap with the corresponding gate lines, and electrically connecting the discontinuous data lines via external conductive elements provided on the color filter for data transmission across the gate lines.

It should be noted that the above description of the embodiments of the disclosed technology presents modification of the structure of the data lines for establishing a connection between the data lines on the array substrate and the data transmission lines on the color filter substrate, but may not change other structures on the array substrate and the color filter substrate. The other structures which are omitted from FIGS. 2 and 3 may be formed on the array substrate and the color filter substrate according to the embodiments of the disclosed technology, as that in a conventional technology.

Second Embodiment

Figure 4:
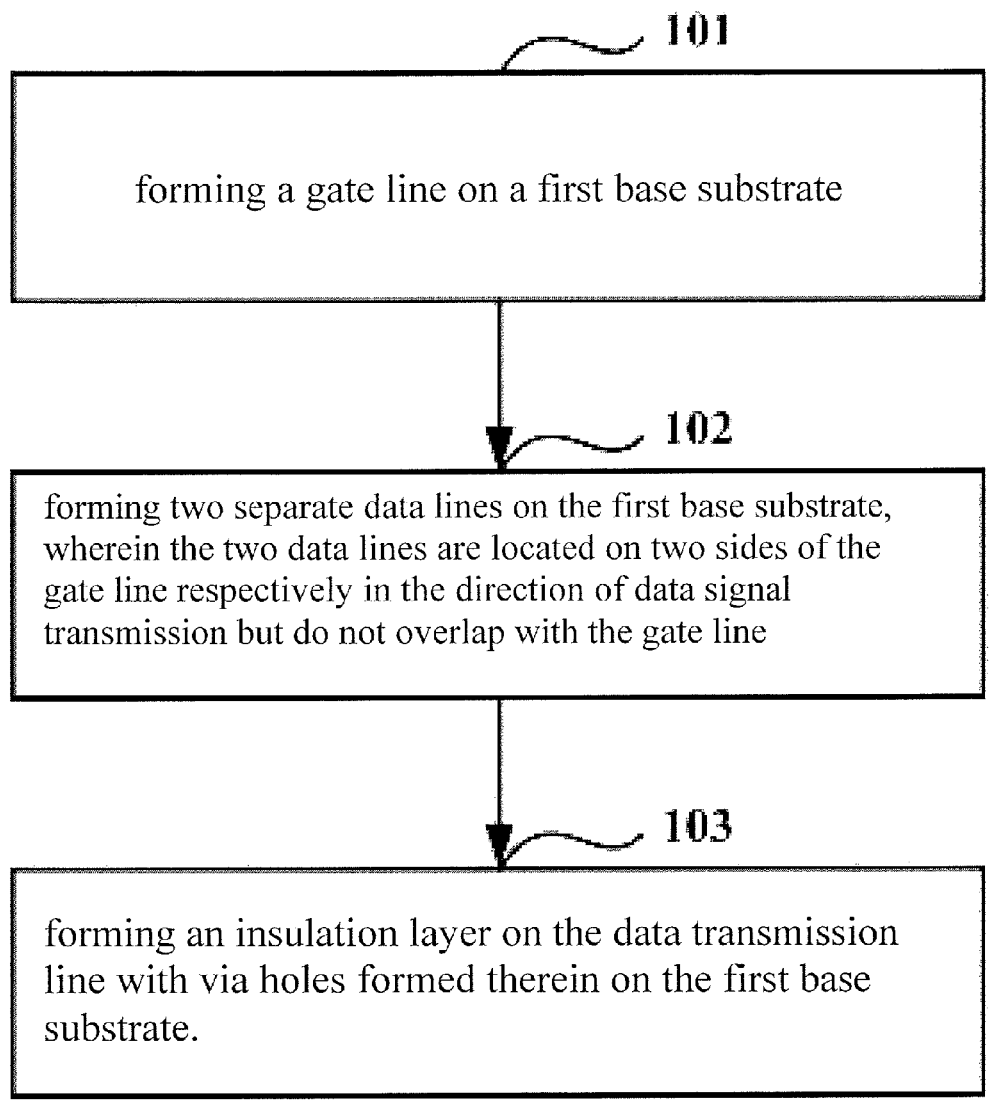
FIG. 4 is a flow chart showing the method for manufacturing an array substrate according to a second embodiment of the disclosed technology.

The second embodiment provides a method for manufacturing a thin film transistor array substrate according to the first embodiment. As shown in FIG. 4, the method according to the second embodiment may comprise the following steps.

Step 101, forming a gate line on a first base substrate;

An example of the above Step 101 may comprise forming a gate metal layer with a thickness of 1000 Å~7000 Å on the first base substrate by a magnetron sputtering process; forming a pattern comprising the gate line and the gate electrode of a thin film transistor, and in one example further forming the electrode of a storage capacitance in predetermined regions on the first base substrate by a photolithography process and a chemical etching process with a gate mask. The gate metal layer may employ any material selected from a group consisting of molybdenum, aluminum, aluminum nickel alloy, molybdenum tungsten alloy, chromium and copper, or any mixed material of the materials mentioned above.

In addition to the processes described above, the Step 101 can be performed by any other processes available for forming a gate line.

Step 102, forming two date lines on the first base substrate with the gate line formed thereon, wherein the two data lines are respectively located on the two sides of the gate respectively in the direction of the data signal transmission but do not overlap with the gate line. The material for the metal layer may be the same as that of the gate line metal layer.

An example of the above Step 102 may comprise the following steps.

Step 1021, sequentially forming a gate insulating layer with a thickness of 1000 Å~6000 Å and an amorphous silicon (a-Si) layer with a thickness of 1000 Å~6000 Å on the first base substrate with the gate line formed thereon by a chemical vapor deposition (CVD) method, and forming an active layer pattern and a channel therein by a photolithography process and a chemical etching process with a gate mask; and Step 1022, depositing a data line metal layer with a thickness of 1000 Å~7000 Å on the first base substrate, and forming the two data lines respectively located on the two sides of the gate respectively in the direction of the data signal transmission, wherein extension direction of the two data lines is perpendicular to but does not overlap with the gate line. At the same time, the source/drain electrodes of the thin film transistor are formed in predetermined regions on the first base substrate by a source/drain mask. A part of one source/drain electrode and a part of the other source/drain electrode are formed on the active layer to be opposite to each other. In addition, a light blocking layer is also formed.

In the above Step 102, the gate insulation layer can be formed on the first substrate with the gate line formed thereon, and then the two data lines are formed on the gate insulation layer, in one example. However, the above Step 102 can form the two data lines at the same level of the gate line without forming the gate insulation layer on the first substrate with the gate line formed thereon, in another example.

Step 103, forming an insulation layer on the first base substrate with the two data lines formed thereon, and forming via holes in the insulation layer.

An example of the above Step 103 may comprise forming a nonmetallic insulation layer (for example, a passivation layer) on the first base substrate with the two data lines formed thereon and forming via holes above the data lines and via holes above the drain/source electrode by a photolithography process and a chemical etching process.

Step 104, forming a pixel electrode layer on the first base substrate, and forming a pixel electrode by a photolithography process and a chemical etching process.

The second embodiment of the disclosed technology also provides a method for manufacturing a color filter substrate, comprising the following steps.

Step 201, depositing a metal layer with a thickness of 1000 Å to 7000 Å on a second base substrate such as a glass substrate and forming a data transmission line by a photolithography process and a chemical etching process. The material for the metal layer may be the same as that of the gate line metal layer.

Step 202, forming a black matrix layer with a thickness of 1 μm to 5 μm on the second substrate with the data transmission line formed thereon and forming the black matrix by a photolithography process and a chemical etching process. The black matrix layer may employ a single layer comprising chromium, chromium oxide, or black resin or a composite layer comprising films of chromium, chromium oxide, or black resin.

Step 203, forming red sub-pixels, green sub-pixels and blue sub-pixels in predetermined regions on the second base substrate.

The red sub-pixels are formed by coating a red pixel pigment layer with a thickness of 1 μm to 5 μm on the second base substrate by a coating & dispersion process and patterning the red pixel pigment layer by a photolithography process and a chemical etching process. The material of the red pixel pigment layer for example is photosensitive acrylic resin or other carboxylic resin with pigments. In addition, the green sub-pixels and the blue sub-pixels can be formed in the same way as the red sub-pixels.

Step 204, forming a common electrode layer on the second base substrate, the common electrode may be a transparent electrode and have a thickness of 1000 Å to 5000 Å.

Step 205, forming a post spacer layer on the second base substrate by a method similar to that for forming the black matrix layer, and forming post spacers by a photolithography process with a mask plate above the transparent electrode. Each of the post spacers has a height of 2 μm to 5 μm and a diameter of 10 μm to 20 μm.

Thus, the array substrate and the color filter substrate according to the embodiment of the disclosed technology are obtained.

Next, the two ends of the data transmission line on the color filter substrate are connected to the corresponding two data lines on the array substrate by conductive elements, respectively. For example, one end of the data transmission line on the color filter substrate is connected to the end adjacent to the gate line of one of the two data lines by at least one conductive element in the via hole above the one of the two data line; the other one end of the data transmission line on the color filter substrate is connected to the end adjacent to the gate line of the other one of the two data lines by at least one conductive element in the via hole above the other one of the two data line.

In another example, as illustrated in FIG. 3.1, an insulation layer 22 may be formed on the data transmission line 21 with via holes 23 being formed above two ends of the data transmission line 21 for connecting with the conductive elements on the array substrate. Such an insulation layer may be a planarization layer.

Although the methods for manufacturing the array substrate and the color filter substrate are thus described in the second embodiment, modification and alternation, such as different number of the lithography processes, different materials or the combination thereof, can be made to the methods, thus forming TFT-LCD in different structures.

Third Embodiment

The third embodiment of the disclosed technology provides a system for manufacturing a thin film transistor array substrate, comprising the following components:

A first component adopted for forming a gate line on a first base substrate; and A second component adopted for forming two data lines, wherein the two data lines are located on the two sides of the gate line respectively in the transmission direction of the data signals but do not overlap with the gate line.

Optionally, the system may further comprise a third component adopted for connecting the two ends of the data transmission line on the color filter substrate to the corresponding ends adjacent to the gate line of the two data lines on the array substrate by conductive elements, respectively.

It should be understood that the components in the third embodiment may comprise the conventional components used for manufacturing a thin film transistor array substrate such as mask plates and lithography equipments as long as they are capable of performing the methods provided by the second embodiment of the disclosed technology. Different form the conventional components used for forming a data line overlapping with a gate line on an array substrate, the second components in the system according to the second embodiment is adopted for forming two data lines which are respectively located on the two sides of the gate line in the transmission direction of the data signals but do not overlap with the gate line.

The third embodiment of the disclosed technology also provides a system for manufacturing a color filter substrate, comprising a fourth component adopted for forming a data transmission line capable of transmitting data signals on the base substrate of the color filter substrate.

The system may further comprise a fifth component adopted for connecting the two ends of the data transmission line on the color filter substrate to the two ends adjacent to the gate line of the two data lines on the array substrate by conductive elements, respectively.

Fourth Embodiment

The fourth embodiment of the disclosed technology provides a display device comprising the TFT array substrate and the color filter substrate, which are bonded together with each other, according to the first embodiment through the third embodiment of the disclosed technology.

The display device comprises a TFT array substrate and a color filter substrate. The TFT array substrate comprises: a first base substrate; a gate line formed on the first base substrate; and two data lines separately formed on the first base substrate, wherein the two data lines are respectively located on the two sides of the gate line in the transmission direction of data signals but do not overlap with the gate line. The color filter substrate comprises: a second base substrate, and a data transmission line formed on the second base substrate and adapted for transmitting data signals, wherein the two ends of the data transmission line on the color filter substrate are connected to the two ends adjacent to the gate line of the two data lines on the array substrate by conductive elements respectively so as to achieve data signal transmission between the two data lines on the TFT array substrate.

Since the data lines respectively located on the two sides of the gate line do not overlap with the gate line on the array substrate in the embodiment of the disclosed technology, the short circuit between the gate lines and the data lines caused by the dielectric breakdown occurred in the overlapping regions between the gate lines and the data lines in the conventional technology may be avoided. On the other hand, since the data transmission line on the color filter substrate is used for electrically conducting the two data lines on the array substrate, the data signals can be transmitted from one to the other of the two data lines, thus ensuring the continuity of signal transmission via the two data lines.

The disclosed technology being thus described, it will be obvious that the same may be varied in many ways. Such variations are not to be regarded as a departure from the spirit and scope of the disclosed technology, and all such modifications as would be obvious to those skilled in the art are intended to be comprised within the scope of the following claims.

What is claimed is:

1. A display device comprising:
a thin film transistor array substrate comprising:
a first base substrate;
a gate line formed on the first base substrate; and
a data line; and
a color filter substrate comprising:
a second base substrate,
wherein, the data line comprises two data line segments and a data transmission line; the data line segments are formed on the first base substrate and are respectively located on two sides of the gate line in a transmission direction of data signals but do not overlap with the gate line; the data transmission line is formed on the second base substrate and adapted for transmitting data signals,
wherein the data transmission line electrically connects the two data line segments on the array substrate,
wherein two ends of the data transmission line on the color filter substrate are respectively connected to the two ends adjacent to the gate line of the two data line segments on the array substrate by conductive elements so as to transmit data signals from one to the other of the two data line segments; and
an insulation layer formed on the data transmission line with via holes being formed above the two ends of the data transmission line for connecting with the conductive elements.

2. The display device according to claim 1, wherein the conductive elements are conductive balls or conductive spacers.

3. The display device according to claim 1, wherein the gate line and the two data line segments are provided at a same level on the TFT array substrate.

4. The display device according to claim 1, wherein the data transmission line corresponds to and cross with one or more gate lines on the array substrate.

5. The display device according to claim 1, further comprising:
a second insulation layer provided on the two data line segments, wherein the two conductive elements are connected to the two ends adjacent to the gate line of the two data line segments respectively through via holes in the second insulation layer.

6. The display device according to claim 1, wherein the gate line is provided under the two data line segments with a gate insulation layer formed therebetween.

* * * * *